(12) United States Patent
Zheng et al.

(10) Patent No.: US 8,864,927 B2
(45) Date of Patent: Oct. 21, 2014

(54) METHOD FOR MAKING CARBON NANOTUBE FILM

(75) Inventors: Gang Zheng, Beijing (CN); Qun-Qing Li, Beijing (CN); Jing Xie, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 165 days.

(21) Appl. No.: 12/840,408

(22) Filed: Jul. 21, 2010

(65) Prior Publication Data

US 2011/0109006 A1    May 12, 2011

(30) Foreign Application Priority Data

Nov. 6, 2009  (CN) .......................... 2009 1 0110046

(51) Int. Cl.
*B32B 37/02* (2006.01)
*B32B 37/10* (2006.01)
(Continued)

(52) U.S. Cl.
CPC ............ *H01L 51/0013* (2013.01); *C23C 16/01* (2013.01); *B82Y 40/00* (2013.01); *B82Y 10/00* (2013.01); *H01L 51/0048* (2013.01); *H01L 51/0508* (2013.01); *C23C 16/26* (2013.01); *B82Y 30/00* (2013.01); *C01B 31/0226* (2013.01); *C01B 31/022* (2013.01)
USPC ............................ 156/235; 156/230; 156/247

(58) Field of Classification Search
CPC .............. C01B 31/022; C01B 31/0226; H01L 51/0508; H01L 51/0048; H01L 51/0013; H01L 21/6835; B32B 27/00; B32B 38/10; B32B 37/12; B82Y 10/00; B82Y 30/00; B82Y 40/00; C23C 16/01; C23C 16/26; G06F 3/10

USPC .................................................. 156/235, 230
See application file for complete search history.

(56) References Cited

U.S. PATENT DOCUMENTS 3,444,732 A * 5/1969 McKinley et al. .......... 73/150 A
6,097,138 A * 8/2000 Nakamoto ................... 313/309
(Continued)

FOREIGN PATENT DOCUMENTS

JP      2007297277 A  * 11/2007
TW      I312165          7/2009
(Continued)

OTHER PUBLICATIONS

Yanxin Zhou et al., "Amethod of printing carbon nanotube thin films", Applied Physics Letters, Mar. 2006,vol. 88, pp. 1-3.

(Continued)

*Primary Examiner* — Sonya Mazumdar
(74) *Attorney, Agent, or Firm* — Novak Druce Connolly Bove + Quigg LLP

(57) ABSTRACT

A method for making a carbon nanotube film is provided. First, a carbon nanotube array is formed on a grown substrate. The carbon nanotube array is pressed with a first substrate using a first pressing force to form a carbon nanotube film precursor. Then the first substrate and the grown substrate are separated, and the carbon nanotube film precursor is transferred onto the first substrate. After that, the carbon nanotube film precursor is pressed using a second substrate with a second pressing force. Lastly, the first substrate and the second substrate is separated, with part of the carbon nanotube precursor transferred to the second substrate to form the carbon nanotube film.

20 Claims, 2 Drawing Sheets

(51) Int. Cl.
*B32B 37/14* (2006.01)
*B32B 37/24* (2006.01)
*H01L 51/00* (2006.01)
*C23C 16/01* (2006.01)
*B82Y 40/00* (2011.01)
*B82Y 10/00* (2011.01)
*C23C 16/26* (2006.01)
*B82Y 30/00* (2011.01)
*C01B 31/02* (2006.01)
*B32B 38/10* (2006.01)
*B32B 38/18* (2006.01)
*H01L 51/05* (2006.01)

(56) References Cited

U.S. PATENT DOCUMENTS

| | | | |
|---|---|---|---|
| 6,340,822 B1* | 1/2002 | Brown et al. | 257/25 |
| 6,866,801 B1* | 3/2005 | Mau et al. | 264/29.1 |
| 7,150,801 B2* | 12/2006 | Fujii et al. | 156/234 |
| 7,439,731 B2* | 10/2008 | Crafts et al. | 324/756.03 |
| 7,507,449 B2* | 3/2009 | Chari et al. | 428/1.1 |
| 7,754,526 B2* | 7/2010 | Jiang et al. | 438/99 |
| 7,799,163 B1* | 9/2010 | Mau et al. | 156/247 |
| 8,048,256 B2* | 11/2011 | Feng et al. | 156/305 |
| 2002/0130311 A1* | 9/2002 | Lieber et al. | 257/1 |
| 2004/0166235 A1 | 8/2004 | Fujii et al. | |
| 2004/0167014 A1* | 8/2004 | Yan et al. | 502/101 |
| 2006/0188721 A1* | 8/2006 | Irvin et al. | 428/402 |
| 2007/0278448 A1* | 12/2007 | Chari et al. | 252/299.01 |
| 2007/0284986 A1 | 12/2007 | Tai et al. | |
| 2008/0075954 A1* | 3/2008 | Wardle et al. | 428/339 |
| 2008/0187648 A1* | 8/2008 | Hart et al. | 427/8 |
| 2009/0183816 A1* | 7/2009 | Min et al. | 156/62.2 |
| 2009/0286362 A1 | 11/2009 | Jiang et al. | |
| 2009/0291534 A1* | 11/2009 | Li et al. | 438/151 |
| 2009/0298259 A1 | 12/2009 | Ling et al. | |
| 2009/0311166 A1* | 12/2009 | Hart et al. | 423/445 B |
| 2011/0291315 A1* | 12/2011 | Roberts et al. | 264/108 |
| 2014/0015158 A1* | 1/2014 | Cola | 264/81 |

FOREIGN PATENT DOCUMENTS

TW 200948708 12/2009
TW 200949954 12/2009

OTHER PUBLICATIONS

Michael C. Mcalpine et al., "Highly ordered nanowire arrays on plastic substrates for ultrasensitive flexible chemical sensors", Nature Materials, Apr. 2007, vol. 6, pp. 379-384.

* cited by examiner

METHOD FOR MAKING CARBON NANOTUBE FILM

RELATED APPLICATIONS

This application claims all benefits accruing under 35 U.S.C. §119 from China Patent Application No. 200910110046.8, filed on Nov. 6, 2009 in the China Intellectual Property Office, the disclosure of which is incorporated herein by reference.

BACKGROUND

1. Technical Field

The present disclosure generally relates to a method for transfer-printing carbon nanotube film.

2. Description of Related Art

Carbon nanotubes (CNT) are a carbonaceous material and have received much interest since the early 1990s. Carbon nanotubes have interesting and potentially useful electrical and mechanical properties. Due to these and other properties, CNTs have become a significant focus of research and development for use in electron emitting devices, sensors, and transistors, among other devices.

Generally, the carbon nanotubes, prepared by conventional methods, are in particle or powder form. The particle/powder-shaped carbon nanotubes limit the number of applications. Thus, preparation of macroscopic carbon nanotube structures has attracted lots of attention.

Carbon nanotube film is one important macroscopic carbon nanotube structure and can be used in a thin film transistor (TFT). Carbon nanotube film can be made by methods using carbon nanotube powders, such as a dropping and drying solvent method, a Langmuir-Blodgett (L-B) method, a printing method, an electrophoresis method, or a membrane filter method. However, the above-described methods generally have complicated fabrication procedures.

What is needed, therefore, is a method for making a carbon nanotube film which can overcome the disadvantages discussed above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
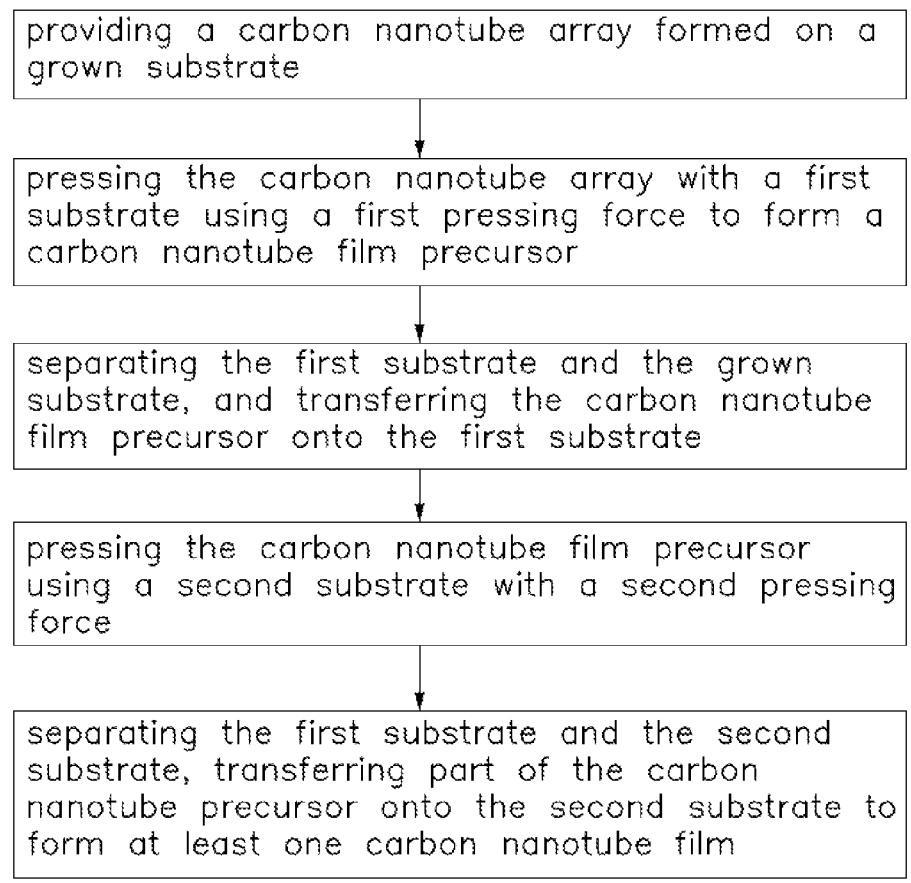
FIG. 1 is a flow chart of one embodiment of a method for making a carbon nanotube film.
Figure 2:
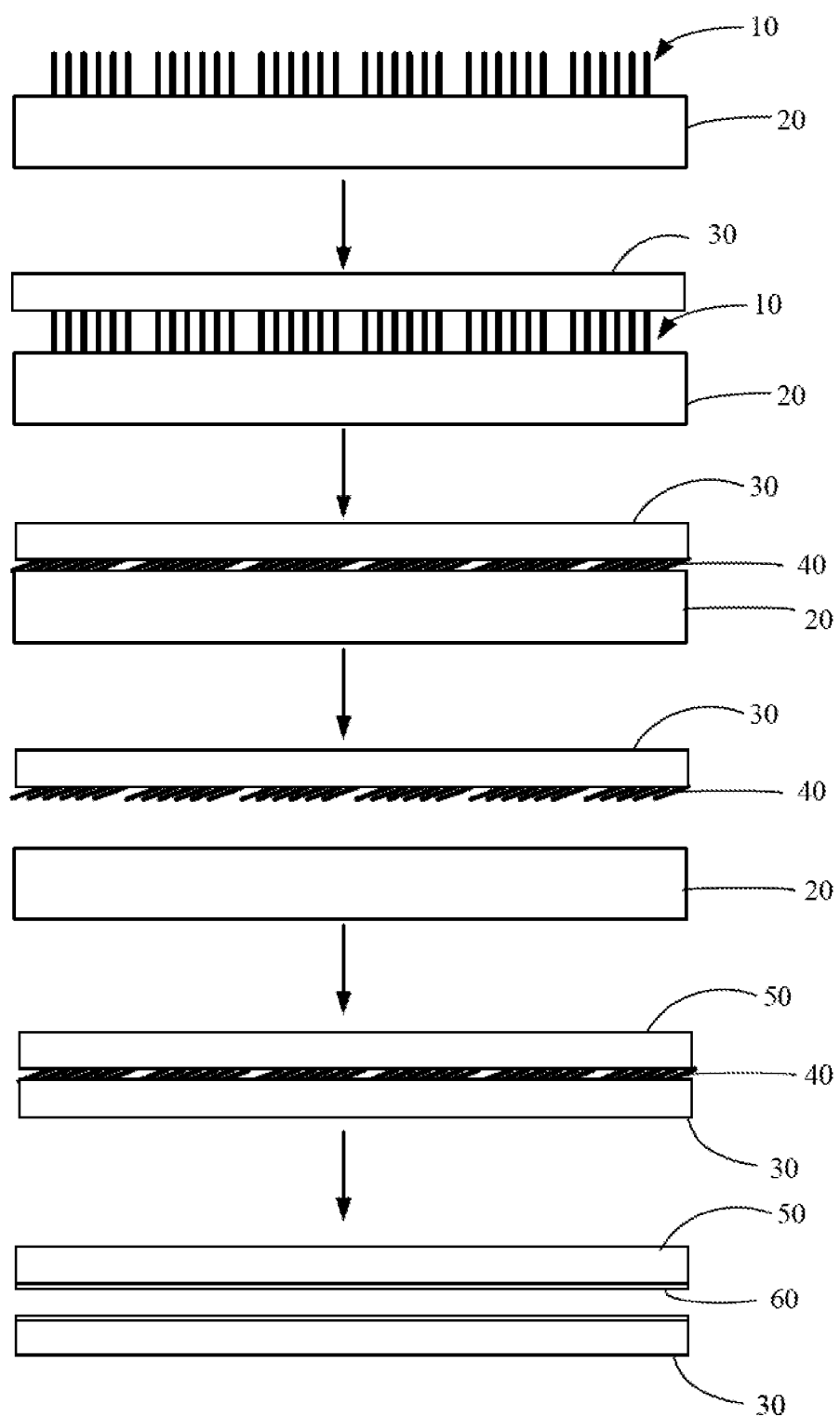
FIG. 2 is a process chart showing the steps of the method of FIG. 1 for making the carbon nanotube film.

Referring to FIG. 1 and FIG. 2, one embodiment of a method for producing a carbon nanotube film includes the following steps:

(S1) providing a carbon nanotube array 10 formed on a grown substrate 20;

(S2) pressing the carbon nanotube array 10 with a first substrate 30 using a first pressing force to form a carbon nanotube film precursor 40;

(S3) separating the first substrate 30 and the grown substrate 20, and transferring the carbon nanotube film precursor 40 onto the first substrate 30;

(S4) pressing the carbon nanotube film precursor 40 using a second substrate 50 with a second pressing force; and (S5) separating the first substrate 30 and the second substrate 50, and transferring part of the carbon nanotube precursor 40 onto the second substrate 50 to form at least one carbon nanotube film 60.

In step (S1), the carbon nanotube array 10 can be formed by the steps of:

(a1) providing the grown substrate 20;

(a2) forming a catalyst layer on the grown substrate 20;

(a3) annealing the grown substrate 20 with the catalyst layer;

(a4) heating the annealed grow substrate 20 in a furnace filled with a protective gas; and (a5) supplying a mixture of a protecting gas and a carbon source gas in the furnace, thereby growing the carbon nanotube array 10.

In step (S1), the carbon nanotube array 10 includes a plurality of carbon nanotubes substantially parallel to each other and approximately perpendicular to the grown substrate 20. The carbon nanotube array 10 includes a first end surface 12 and a second end surface 14. Once the carbon nanotube array 10 is formed on the grown substrate 20, the second end surface 14 of the carbon nanotube array 10 is connected to a top surface of the grown substrate 20, and the carbon nanotubes in the carbon nanotube array 10 extend approximately perpendicularly away from the top surface of the grown substrate 20. A material of the grown substrate 20 can be silicon or silicon dioxide. In one embodiment, the material of the grown substrate 20 is silicon. Alternatively, in another embodiment, some of the carbon nanotubes in the carbon nanotube array 10 can be removed to form a pattern in the carbon nanotube array 10. For example, after some of the carbon nanotubes are removed, the other carbon nanotubes in the carbon nanotube array 10 form a plurality of strips. Each of the strips includes a plurality of carbon nanotubes substantially perpendicular to the grown substrate 20. A distance between the adjacent strips can be in a range from about 10 micrometers to about 1 millimeter.

In step (S2), the first substrate 30 will contact the first end surface 12 of the carbon nanotube array 10. A material of the first substrate 30 is not limited, although a combined force between the carbon nanotube film precursor 40 and the first substrate 30 must be greater than a combined force between the carbon nanotube array 10 and the grown substrate 20. A material of the first substrate 30 can be polyethylene terephthalate (PET), polydimethylsiloxane, polypropylene, polyvinyl chloride (PVC), polyethylene, polystyrene or polyethylene terephthalate (PBT). In one embodiment, the material of the first substrate 30 is PET.

In step (S2), the first pressing force is applied along a first direction L1. An angle α can be formed between the first direction L1 of the first pressing force and the grown substrate 20, such that $0°<α≤90°$. In one embodiment, α is about 90°. The first pressing force can be larger than 1 MPa. For example, the first pressing force can be in a range from about 10 MPa to about 15 MPa. The first pressing force will be maintained longer than about 5 seconds. In one embodiment, it is longer than about 60 seconds. After being pressed by the first pressing force, the carbon nanotubes in the carbon nanotube array 10 is compressed onto the grown substrate 20 to form the carbon nanotube film precursor 40. The carbon nanotube film precursor 40 contacts and combines closely with the first substrate 30. An orientation direction of the carbon nanotubes in the carbon nanotube precursor 40 is determined by the first direction L1. If the angle α is about 90°, the carbon nanotubes will be isotropically disposed. If the angle α is less than about 90°, that is to say, the first pressing force has a horizontal force component, the carbon nanotubes will be oriented along a direction of the horizontal force component. The carbon nanotubes are overlapped with each other and joined with each other by Van der Waals attractive force in the carbon nanotube film precursor 40. The Van der Waals attractive force between the carbon nanotubes can be larger than the combined force between the grown substrate 20 and the carbon nanotube film precursor 40. A thickness of the carbon nanotube film precursor 40 can be in a range from about 20 micrometers to about 30 micrometers.

In step (S3), the combined force between the carbon nanotube film precursor 40 and the first substrate 30 is greater than the combined force between the carbon nanotube film precursor 40 and the grown substrate 20. Thus, after separating the grown substrate 20 and the first substrate 30, the carbon nanotube film precursor 40 will be attached on a surface of the first substrate 30.

In step (S4), a material of the second substrate 50 can be polyethylene terephthalate, polydimethylsiloxane, polypropylene, polyvinyl chloride, polyethylene, polystyrene or polyethylene terephthalate. The material of the second substrate 50 can be the same as the material of the first substrate 30. In one embodiment, the material of the second substrate 50 is PET.

In step (S4), the carbon nanotube precursor 40 has a first surface (not labeled) and a second surface (not labeled) opposite to the first surface. The first surface is physically contacting with the first substrate 30, and the second surface is physically contacting with the second substrate 50. Because the carbon nanotubes in the carbon nanotube precursor 40 are overlapped with each other, some carbon nanotubes are contacting and combined with the first substrate 30, some carbon nanotubes are contacting and combined with the second substrate 50, and the rest of the carbon nanotubes are contacting neither the first substrate 30 nor the second substrate 50. The carbon nanotubes contacting neither the first substrate 30 nor the second substrate 50 are disposed in the middle portion of the carbon nanotube film precursor 40. The combined force between the carbon nanotube film precursor 40 and the first substrate 30 is larger than the Van der Waals attractive force between the carbon nanotubes.

In step (S4), the second pressing force is less than the first pressing force, and can be larger than 1 MPa, for example, the second pressing force can be in a range from about 3 MPa to about 8 MPa. The second pressing force will be maintained longer than about 5 seconds. In one embodiment, it is longer than about 60 seconds.

In step (S5), because the combined force between the first substrate 30 and the carbon nanotube precursor 40 is larger than the Van der Waals attractive force between the carbon nanotubes, and is less than or equal to the combining force between the second substrate 50 and the carbon nanotube precursor 40. The carbon nanotube precursor 40 will be separated into two parts when the first substrate 30 and the second substrate 50 are separated from each other. The carbon nanotubes contacting and combining with the first substrate 30 will be attached on the first substrate 30, and the carbon nanotubes that are contacting and combining with the second substrate 50 will be attached on the second substrate 50. The second surface of the carbon nanotube film precursor 40 will be attached on the second substrate 50 after the first substrate 30 and the second substrate 50 are separated. The carbon nanotubes attached on the second substrate 50 form the carbon nanotube film 60. A thickness of the carbon nanotube film 60 can be in a range from about 50 nanometers to about 1 micrometer. In one embodiment, if the carbon nanotubes in the carbon nanotube array 10 form the plurality of strips, a plurality of carbon nanotube films will be formed on the second substrate 50. Because the second substrate 50 is transparent PET, the plurality of carbon nanotube films and the substrate 50 can be used to make a TFT.

Alternatively, the carbon nanotube film 60 can be soaked in a liquid to decrease the thickness of the carbon nanotube film 60. In one embodiment, the carbon nanotube film 60 and the second substrate 50 can be washed in an acetone solvent. The carbon nanotube film 60 and the second substrate 50 are put in the acetone solvent and are bombarded with ultrasonic pulses for about 10 minutes, so the thickness of the carbon nanotube film can be less than 50 nanometers. Thus, the method of making the carbon nanotube film 60 is simple.

In another embodiment, a method for producing a carbon nanotube film includes the following steps:

(M1) providing a carbon nanotube array having a first end surface and a second end surface formed on a grown substrate, the second end surface is physically contacting with the grown substrate;

(M2) providing a polymer in a liquid state, and applying the polymer on the carbon nanotube array from the first surface;

(M3) pressing the carbon nanotube array with a first substrate using a first pressing force to form a carbon nanotube film precursor;

(M4) separating the first substrate and the grown substrate, and transferring the carbon nanotube film precursor onto the first substrate;

(M5) pressing the carbon nanotube film precursor using a second substrate with a second pressing force; and (M6) separating the first substrate and the second substrate, part of the carbon nanotube precursor is transferred to the second substrate to form at least one carbon nanotube film.

The detailed process of M1 can be the same as the step S1 discussed above.

In step (M2), the polymer material can be thermoplastic polymer or thermosetting polymer. The thermosetting material can be selected from epoxy resin, bismaleimide resin, cyanate ester resin, silicone rubber, polydimethylsiloxane, or PMMA. The thermoplastic material can be selected from polypropylene, polyethylene, polyvinyl alcohol, or polymethacrylate resin. The polymer in liquid state can be applied on the second surface of the carbon nanotube array by a coating method, spraying method, or dropping method. The polymer can be heated to a liquid state. The carbon nanotube array includes a plurality of carbon nanotubes, with gaps formed between the carbon nanotubes. As such, some of the liquid polymer will collect in these gaps. A polymer layer can be formed on the first surface of the carbon nanotube array after the liquid polymer is applied on the first surface. In one embodiment, the polymer layer can be solidified.

In step (M3), the first substrate will contact with the polymer layer. In addition, a combined force between the polymer layer and the first substrate is larger than a combined force between the carbon nanotube film precursor and the grown substrate. A combined force between the polymer layer and the carbon nanotube array is larger than the combined force between the carbon nanotube film precursor and the grown substrate. If the polymer is still in a liquid state, after pressing with the first substrate, the liquid polymer will infiltrate into the carbon nanotube array, so that the carbon nanotube film precursor becomes a composite structure. The other detailed process in step (M3) is similar to step (S2) disclosed above.

The detailed process of M4 is similar to step S3 discussed above.

The detailed process of M5 is similar to step S4 discussed above.

The detailed process of M6 is similar to step S5 discussed above.

It is to be understood that the above-described embodiments are intended to illustrate rather than limit the disclosure. Variations may be made to the embodiments without departing from the spirit of the embodiments as claimed. The above-described embodiments illustrate, but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What claimed is:

1. A method for making a carbon nanotube film comprising the following steps:
    fabricating a carbon nanotube array on a grown substrate, wherein the carbon nanotube array comprises a plurality of carbon nanotubes substantially perpendicular with the grown substrate;
    pressing the carbon nanotube array with a first substrate by applying a first pressing force to cause the plurality of carbon nanotubes in the carbon nanotube array being compressed onto the grown substrate and overlapped with each other to form a carbon nanotube film precursor;
    separating the first substrate and the grown substrate comprising the carbon nanotube film precursor, and transferring the carbon nanotube film precursor onto the first substrate;
    pressing the carbon nanotube film precursor on the first substrate by applying a second substrate with a second pressing force; and
    separating the first substrate and the second substrate, and transferring a part of the carbon nanotube film precursor to the second substrate to form a carbon nanotube film.

2. The method of claim 1, wherein the carbon nanotube array is fabricated by the following sub-steps:
    providing a grown substrate;
    forming a catalyst layer on the grown substrate;
    annealing the grown substrate with the catalyst layer;
    heating the annealed substrate in a furnace filled with a protective gas; and
    supplying a mixture of a protecting gas and a carbon source gas in the furnace, thereby growing the carbon nanotube array.

3. The method of claim 1, comprising fabricating the carbon nanotube array into a plurality of strips, wherein a distance between adjacent strips of the plurality of strips is in a range from about 10 micrometers to about 1 millimeter.

4. The method of claim 3, further comprising forming each of the plurality of strips into one carbon nanotube film.

5. The method of claim 1, wherein the first pressing force is applied to the carbon nanotube array for longer than about 5 seconds.

6. The method of claim 1, wherein the first pressing force is in a range from about 10 MPa to about 15 MPa.

7. The method of claim 1, comprising applying the first pressing force at an angle $\alpha$ from a flat surface defined by the grown substrate, wherein the angle $\alpha$ is from 0° to about 90°.

8. The method of claim 7, wherein the angle $\alpha$ is about 90°, and the plurality carbon nanotubes of the carbon nanotube array are being isotropically pressed into the carbon nanotube film precursor.

9. The method of claim 1, wherein an adhesive force between the carbon nanotube array and the first substrate is greater than an adhesive force between the carbon nanotube array and the grown substrate.

10. The method of claim 9, wherein the carbon nanotube film precursor comprises carbon nanotubes joined with each other by Van der Waals attractive force, and the Van der Waals attractive force is greater than the adhesive force between the carbon nanotube array and the grown substrate.

11. The method of claim 10, wherein a adhesive force between the first substrate and the carbon nanotube film precursor is larger than the Van der Waals attractive force between the carbon nanotubes, and is less than or equal to a adhesive force between the second substrate and the carbon nanotube film precursor.

12. The method of claim 1, wherein a material of the first substrate or the second substrate is polydimethylsiloxane, polypropylene, polyvinyl chloride, polyethylene, polystyrene or polyethylene terephthalate.

13. The method of claim 1, wherein the second pressing force is less than the first pressing force, the second pressing force is in a range from about 3 MPa to about 8 MPa.

14. The apparatus of claim 1, wherein a thickness of the carbon nanotube film is in a range from about 50 nanometers to about 1 micrometer.

15. The method of claim 1, further comprising washing the carbon nanotube film by putting the carbon nanotube film and the second substrate in a solvent.

16. The method of claim 1, further comprising providing a polymer in a liquid state and applying the polymer on a top of the carbon nanotube array before pressing the carbon nanotube array with the first substrate.

17. The method of claim 16, further comprising forming a polymer layer on the top surface of the carbon nanotube array after the liquid polymer is applied on the top surface, wherein the first substrate is physically contacting the polymer layer.

18. The method of claim 16, wherein the carbon nanotube array comprises the plurality of carbon nanotubes, and the method further comprises forming gaps between the plurality of carbon nanotubes, and applying the liquid polymer in the gaps.

19. The method of claim 16, wherein an adhesive force between the polymer layer and the first substrate is larger than a adhesive force between the carbon nanotube film precursor and the grown substrate, and a adhesive force between the polymer layer and the carbon nanotube array is larger than the combined force between the carbon nanotube film precursor and the grown substrate.

20. The method of claim 16, wherein the material of the polymer is selected from the group consisting of epoxy resin, bismaleimide resin, cyanate ester resin, silicone rubber, polydimethylsiloxane, PMMA, polypropylene, polyethylene, polyvinyl alcohol, and polymethacrylate resin.

* * * * *